United States Patent
Tu et al.

(10) Patent No.: US 8,440,488 B2
(45) Date of Patent: May 14, 2013

(54) MANUFACTURING METHOD AND STRUCTURE FOR WAFER LEVEL IMAGE SENSOR MODULE WITH FIXED FOCAL LENGTH

(75) Inventors: Hsiu-Wen Tu, Hsin-Chu Hsien (TW); Han-Hsing Chen, Hsin-Chu Hsien (TW); Chung-Hsien Hsin, Hsin-Chu Hsien (TW); Ming-Hui Chen, Hsin-Chu Hsien (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 240 days.

(21) Appl. No.: 12/948,020

(22) Filed: Nov. 17, 2010

(65) Prior Publication Data
US 2011/0279815 A1 Nov. 17, 2011

(30) Foreign Application Priority Data
May 17, 2010 (TW) .............................. 99115729 A

(51) Int. Cl.
*H01L 21/00* (2006.01)
(52) U.S. Cl.
USPC .................. 438/55; 438/64; 438/14; 438/15; 257/E27.001

(58) Field of Classification Search .................... 438/55, 438/64, 14, 15; 257/E27.001
See application file for complete search history.

(56) References Cited

U.S. PATENT DOCUMENTS

| | | | |
|---|---|---|---|
| 6,180,948 B1 * | 1/2001 | Gutekunst et al. | 250/458.1 |
| 2009/0068798 A1 * | 3/2009 | Oliver et al. | 438/127 |
| 2009/0206431 A1 * | 8/2009 | Bolken et al. | 257/432 |
| 2009/0217516 A1 * | 9/2009 | Pawlowski et al. | 29/832 |

* cited by examiner

*Primary Examiner* — Julia Slutsker
(74) *Attorney, Agent, or Firm* — Juan Carlos A. Marquez

(57) ABSTRACT

This present invention discloses a manufacturing method and structure for a wafer level image sensor module with fixed focal length. The method includes the following steps. First, a silicon wafer comprising several image sensor chips having a photosensitive area and a lens module array wafer comprising several wafer level lens modules with fixed focal length are provided. Next, the image sensor chips and the wafer level lens modules are sorted in grades according to the different quality grades. According to the sorting results, each of the wafer level lens modules is assigned to be situated above the image sensor chip that has the same grade. At the same time, each of the wafer level lens modules is directed to face the photosensitive area of each image sensor chip. Finally, in the packaging process, the wafer level lens module is surrounded by an encapsulation material.

4 Claims, 15 Drawing Sheets

MANUFACTURING METHOD AND STRUCTURE FOR WAFER LEVEL IMAGE SENSOR MODULE WITH FIXED FOCAL LENGTH

BACKGROUND OF THE INVENTION

1. Technical Field

The present invention relates to image sensor modules, and more particularly, to a manufacturing method and structure for a wafer level image sensor module with fixed focal length contributing to reduced height and simplified process of wafer level image sensor modules.

2. Description of Related Art

In a conventional camera module, there are an image sensor, an IR filter, lenses and a holder for holding the above components. The image sensor is a semiconductor device for capturing images of articles and is widely used in digital still cameras (DSCs), digital video cameras (DVs), security monitoring systems, mobile phones, vehicle image sensor modules and other electronic products. For catering to the demands of various electronic products about compactness and mass manufacturing, it is desired to effectively simplify the manufacturing process and downsize image sensor modules, and therefore all the related manufacturers have worked hard to improve the manufacturing process and structure.

There are two major approaches to packaging image sensor modules. The first one is the so-called COB (Chip On Board) process, in which an image sensing chip is directly installed on a substrate and metal wires are provided to electrically connect the image sensor chip and the substrate. Then, a transparent lid (such as a glass window) is mounted above the image sensor chip to allow light to pass through the transparent lid and be captured by the image sensor chip. The other approach is known as the CSP (Chip Scale Package) process. Image sensor modules packaged through the chip level packaging method are more desired as the compactness of the packaged structures is considered.

However, problems and limitations occur when the COB process is implemented to package image sensor modules, including the low production rate due to the unit level packaging, high defective rate caused by dust introduced during the process, high cost for building and maintaining clean rooms, limitation to microminiaturization, and so on.

From the above description, it is learned that the production yield highly depends on the adopted packaging process and structure, and downsizing image sensor modules in height and volume is generally desired. Besides, significantly reducing the cycle time of the process for manufacturing image sensor modules and improving throughput as well as overall production yield of the products would also be helpful to expand application scope of image sensor modules on the market.

SUMMARY OF THE INVENTION

In view of all the above facts, the present invention herein provides a manufacturing method and structure for a wafer level image sensor module with fixed focal length, wherein image sensor chips and wafer level lens modules are sorted according to their different quality grades, and according to the sorting results, each wafer level lens module is assigned to be situated above the image sensor chip having the same grade, thereby improving production yield of the wafer level image sensor modules.

The present invention provides a manufacturing method and structure for a wafer level image sensor module with fixed focal length, wherein in a packaging process, the wafer level lens module is surrounded by an encapsulation material, so as to provide shading without using additional shadow masks or additionally coating a shading material at the lateral of the wafer level lens module.

The present invention provides a manufacturing method and structure for a wafer level image sensor module with fixed focal length, wherein an encapsulation material surrounding the wafer level lens module blocks light from entering the image sensor chip through a lateral of the wafer level lens module, so as to ensure the image sensing performance of the wafer level image sensor module.

The present invention provides a manufacturing method and structure for a wafer level image sensor module with fixed focal length, which uses a wafer level process to reduce the height of wafer level image sensor modules, and in turn reduce costs because of the reduced consumption of material.

To achieve the aforementioned effects, the present invention provides the manufacturing method for the wafer level image sensor module with fixed focal length, comprising steps of: providing a silicon wafer including a plurality of image sensor chips, wherein each said image sensor chip has a photosensitive area; providing a lens module array wafer that includes a plurality of wafer level lens modules, wherein each said wafer level lens module has a fixed focal length; sorting the image sensor chips and the wafer level lens modules in grades according to different quality grades; according to the sorting results, assigning each said wafer level lens module to be situated above the image sensor chip that has the same grade and making each said wafer level lens module aligned with a respective said photosensitive area; and performing a packaging process by applying an encapsulation material onto a first surface of the silicon wafer, and making the encapsulation material surround the wafer level lens modules.

To achieve the above effects, the present invention further provides a structure for a wafer level image sensor module with fixed focal length, comprising: an image sensor chip including a plurality of photosensitive elements that are situated in a photosensitive area on a first surface of the image sensor chip; a plurality of first contacts provided on the first surface and electrically connected to the photosensitive elements; and a plurality of conducting channels passing through the image sensor chips and having one end electrically connected to the first contacts; a wafer level lens module correspondingly situated above the photosensitive area and having a fixed focal length; and an encapsulation material situated on the first surface and surrounding the wafer level lens module.

By implementing the present invention, at least the following progressive effects can be achieved:

1. The quality-based sorting mechanism allows good wafer level lens modules and good image sensor chip to be assembled mutually, so as to improve the production yield of the wafer level image sensor modules, making the disclosed method more suitable for mass manufacturing.

2. The wafer level packaging method downsizes wafer level image sensor modules in both height and volume so as to save material and in turn reduce costs.

3. The encapsulation material serves to not only package wafer level image sensor modules and protect wafer level lens modules, but also block light from entering image sensor chips from laterals of wafer level lens modules and causing stray light.

4. Since the wafer level lens module is a pre-assembled and pre-tested module, a focusing procedure can be omitted, thereby reducing investment and costs for related equipment and labor power and simplifying the manufacturing process of the wafer level image sensor module.

5. Since the wafer level lens module has been pre-assembled and pre-tested, the assembly of components is easier and involves fewer joint interfaces so as to significantly reduce accumulated tilt tolerances, while the tilt control of the wafer level lens module with respective to the imaging plane is more manageable, thereby improving the production yield of the wafer level image sensor modules.

6. The disclosed structure satisfies the common need of electronic products for compactness.

BRIEF DESCRIPTION OF THE DRAWINGS

The invention as well as a preferred mode of use, further objectives and advantages thereof will be best understood by reference to the following detailed description of illustrative embodiments when acquire in conjunction with the accompanying drawings, wherein.

DETAILED DESCRIPTION OF THE INVENTION

Figure 1:
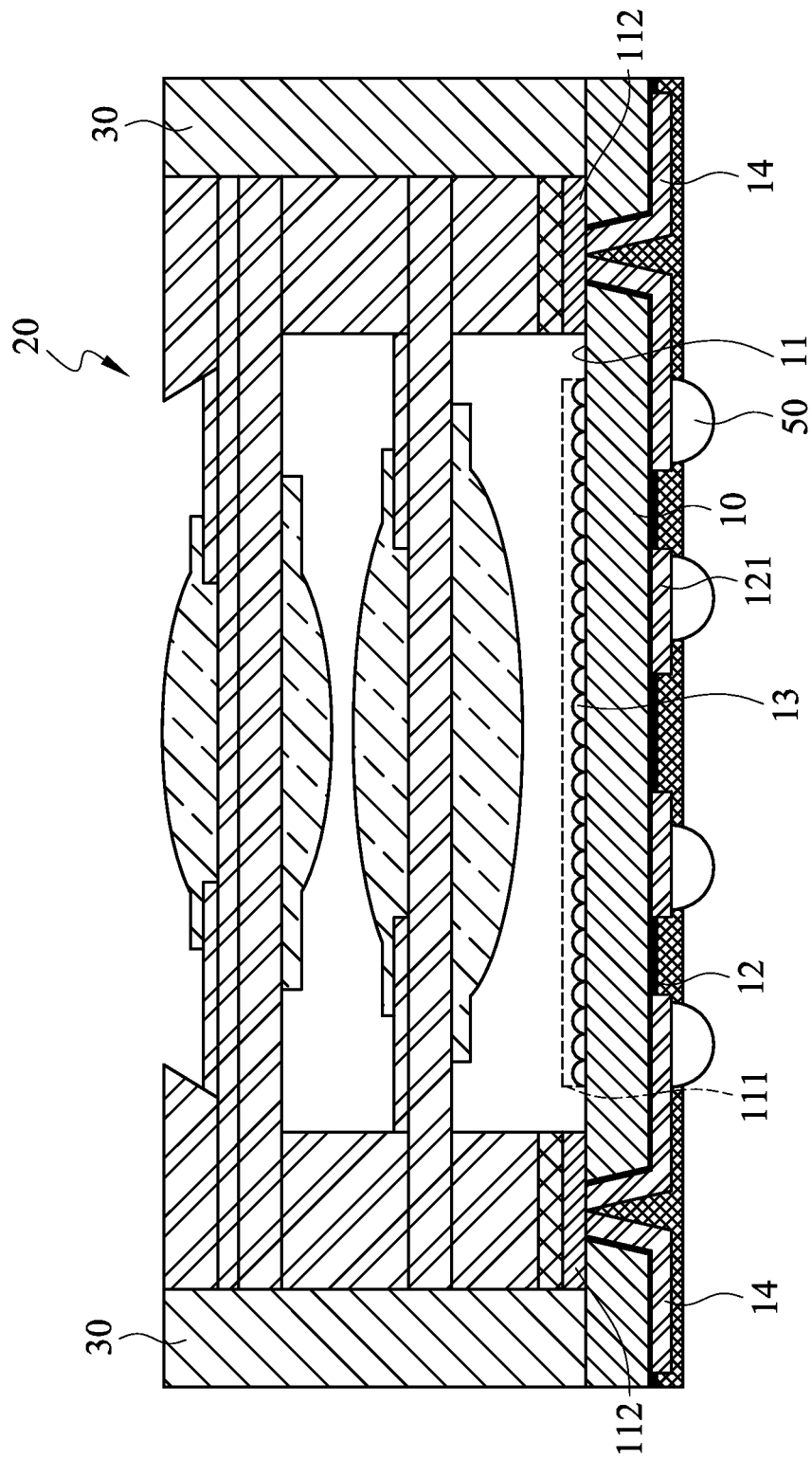
FIG. 1 is one embodiment of a structure for a wafer level image sensor module with fixed focal length according to the present invention.

Referring to FIG. 1, an embodiment of the present invention provides a structure for a wafer level image sensor module with fixed focal length. The structure includes an image sensor chip 10, a wafer level lens module 20 and an encapsulation material 30.

The image sensor chip 10 has a first surface 11 and a second surface 12, being the upper and lower surfaces of the image sensor chip 10, respectively. The first surface 11 is provided with a plurality of photosensitive elements 13, which are arrayed in a photosensitive area 111 of the first surface 11 for sensing light. The first surface 11 is also provided with a plurality of first contacts 112, which surround outside the photosensitive area 111 and are electrically connected to the photosensitive elements 13 (through an internal circuit of the image sensor chip 10).

The image sensor chip 10 includes a plurality of conducting channels 14, which pass through the image sensor chip 10, and having two ends electrically connected to the first contacts 112 and a plurality of solder ball pads 121 on the second surface 12, respectively. The conducting channel 14 acts as a passage linking the photosensitive elements 13 and external electrical connection.

The second surface 12 of the image sensor chip 10 may further be placed with solder balls 50 that are electrically connected to the solder ball pads 121, so as to form a ball grid array 51 (referring also to FIG. 8) on the second surface 12. The solder balls 50 are not only electrically connected to the solder ball pads 121, but also electrically connected to the conducting channel 14 through the solder ball pads 121, thus being able to act as an interface between the photosensitive elements 13 and external electrical connection.

Please refer to FIG. 1. The wafer level lens module 20 is situated above the photosensitive area 111. The wafer level lens module 20 refers to a high accuracy lens set made through a wafer making process and precisely tested when manufactured so that the wafer level lens module 20 has a fixed focal length. In addition, since the wafer level lens module 20 is a pre-assembled and pre-tested module, a focusing procedure can be omitted from the manufacturing process of the disclosed wafer level image sensor module, thereby reducing investment and costs for related equipment and labor power.

The encapsulation material 30 covers the first surface 11 and surrounds the wafer level lens module 20. Depending on different packaging methods, the encapsulation material 30 may be a mold compound or a liquid compound. Furthermore, the encapsulation material 30 may be an opaque material, so that the opaque encapsulation material 30 can avoid light to enter the wafer level image sensor module from a lateral of the wafer level lens module 20.

Figure 2:
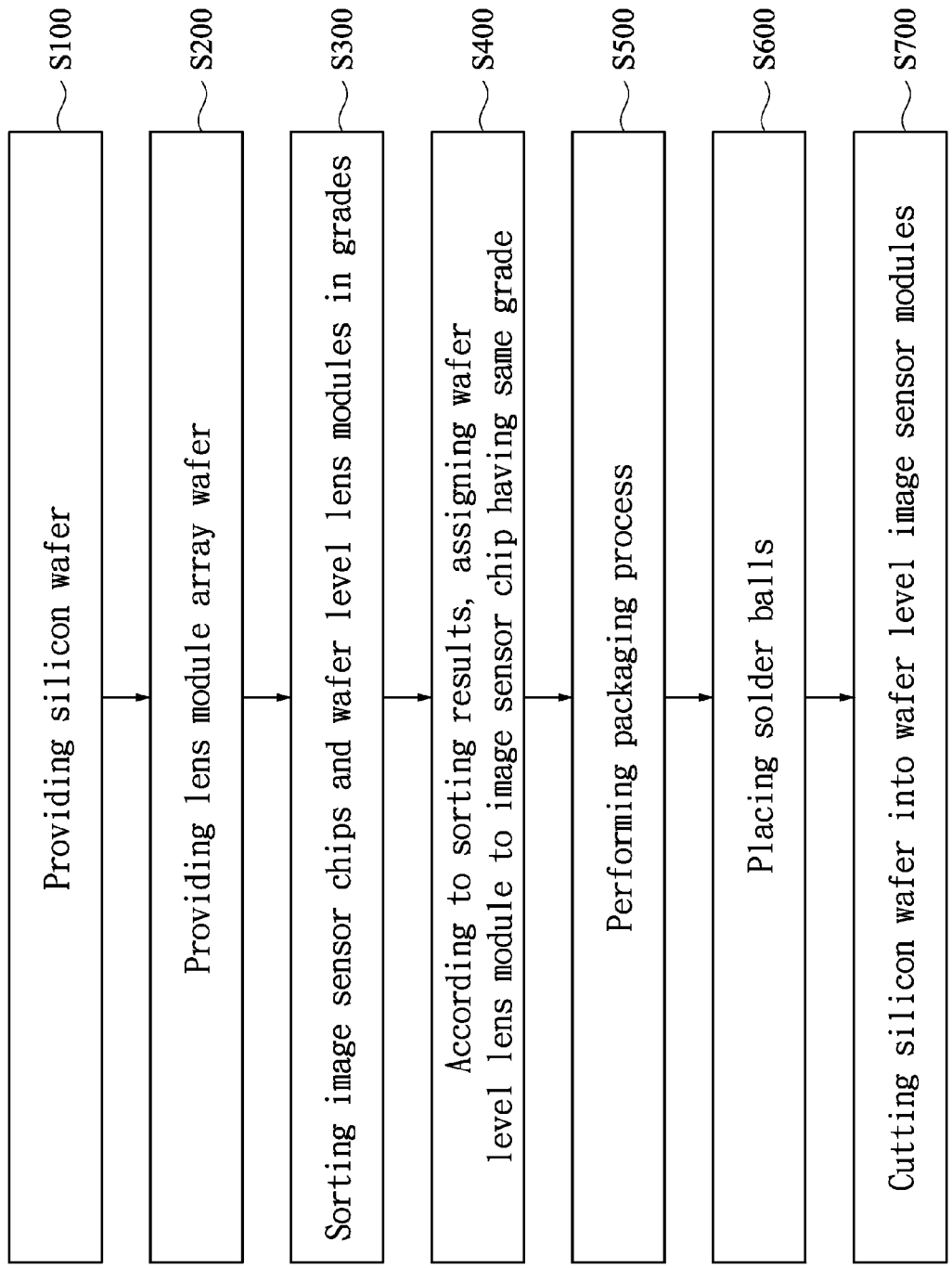
FIG. 2 is a flow chart of a manufacturing method for the wafer level image sensor module with fixed focal length according to one embodiment of the present invention.
Figure 3:
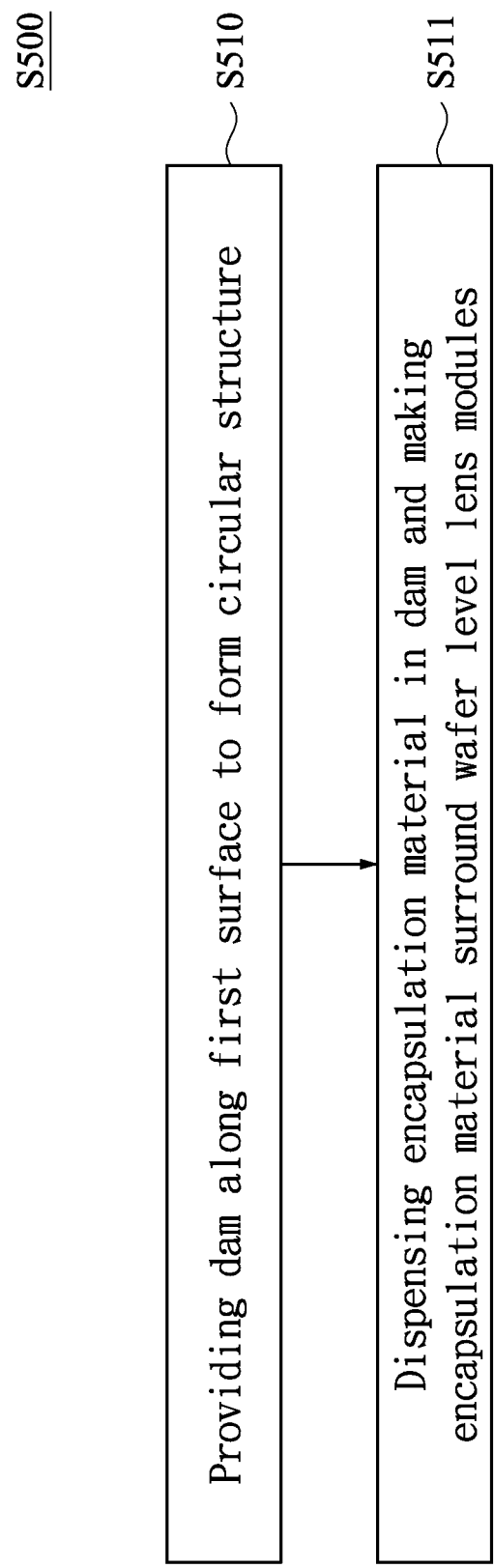
FIG. 3 is a flow chart of a packaging process of FIG. 2 according to a first aspect.
Figure 4:
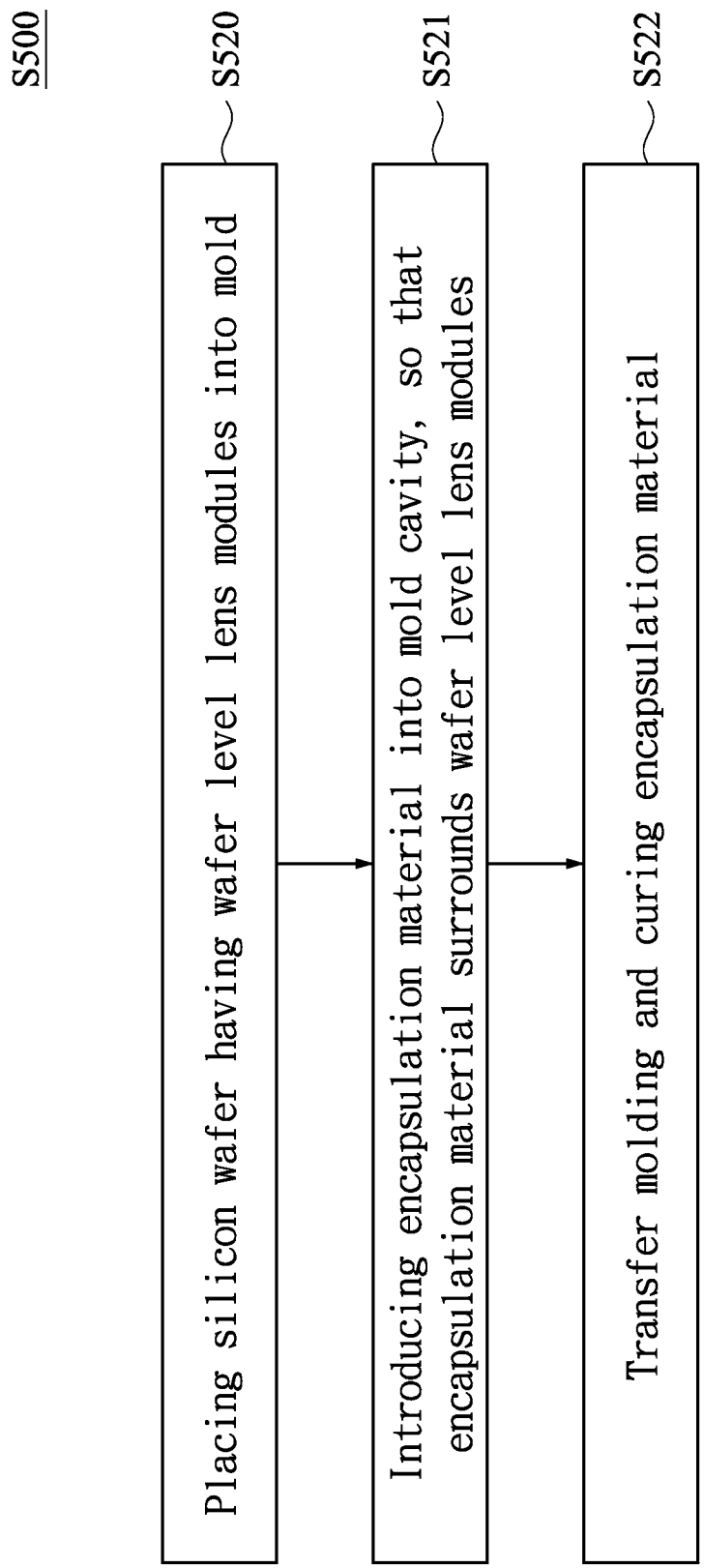
FIG. 4 is a flow chart of a packaging process of FIG. 2 according to a second aspect.

As shown in FIG. 2 to FIG. 4, a manufacturing method for such wafer level image sensor modules with fixed focal length involves the following steps: providing a silicon wafer (S100); providing a lens module array wafer (S200); sorting the image sensor chips and the wafer level lens modules in grades according to different quality grades (S300); according to the sorting results, assigning each said wafer level lens module to be situated above the image sensor chip that has the same grade (S400); performing a packaging process (S500); placing solder balls (S600); and cutting the silicon wafer to form a plurality of wafer level image sensor modules (S700).

Figure 5A:
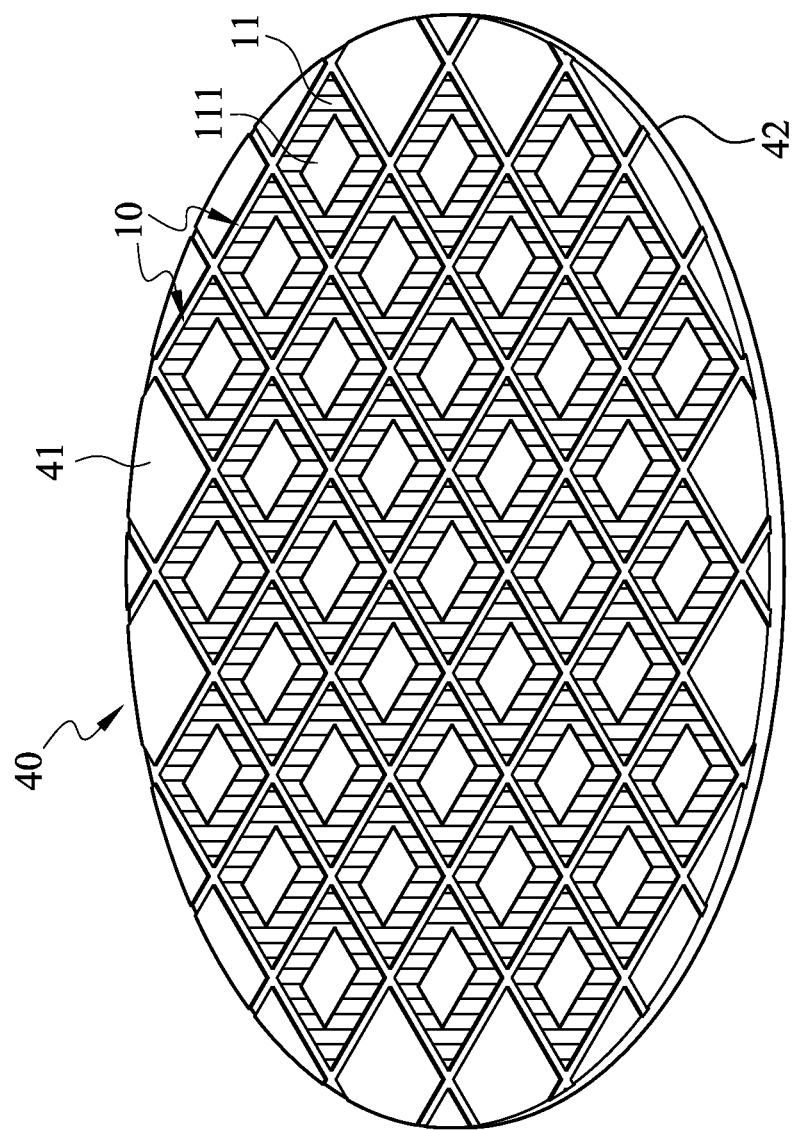
FIG. 5A is a schematic drawing of a silicon wafer having a plurality of image sensor chips according to one embodiment of the present invention.

In the step of providing a silicon wafer (S100), as shown in FIG. 5A, the silicon wafer 40 may be a through-silicon via (TSV) wafer. In the TSV wafer whose sectional structure is as shown in FIG. 1, through holes are formed in the wafer and the conducting channel 14 is formed in the through hole, so as to use the conducting channel 14 to be electrically connected to the first contacts 112 on the first surface 41 of the silicon wafer 40 (i.e. the first surface 11 of the image sensor chip 10). The conducting channel 14 may be extended to the second surface 42 (i.e. the second surface 12 of the image sensor chip 10). Moreover, a re-distribution layer (not shown) may be provided on the second surface 42 and electrically connected to the solder ball pads 121 in the formed of a land grid array (LGA), so as to form wiring between the solder ball pads 121 through the re-distribution layer.

The silicon wafer 40 comprises a plurality of image sensor chips 10, and each of the image sensor chips 10 has a first surface 11 (i.e. the first surface 41 of the silicon wafer 40) provided with a photosensitive area 111, while the first contacts 112 surround the photosensitive area 111 (referring to FIG. 1).

Figure 5B:
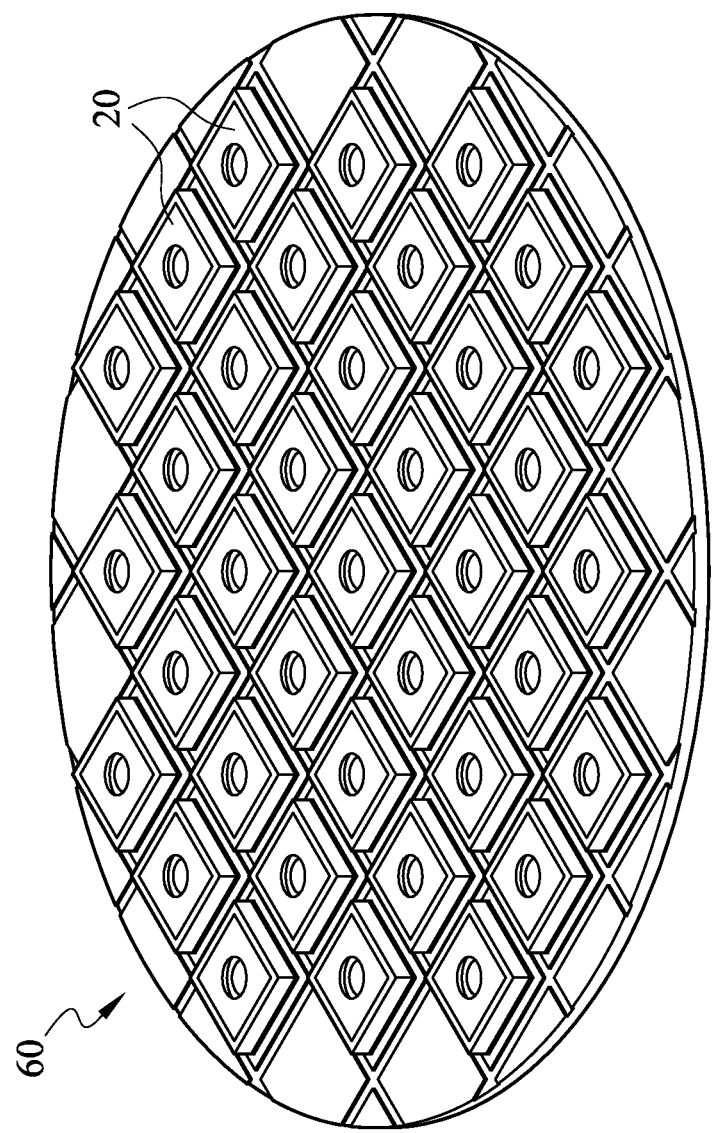
FIG. 5B is a schematic drawing of a lens module array wafer having wafer level lens modules according to one embodiment of the present invention.

In the step of providing a lens module array wafer (S200), as shown in FIG. 5B, the lens module array wafer 60 is a high accuracy lens set made through a wafer making process and comprising a plurality of wafer level lens modules 20. In addition, since the wafer level lens module 20 has been precisely tested when manufactured, it already has the tested fixed focal length. The lens module array wafer 60 can be cut into a plurality of wafer level lens modules 20.

Then the step of sorting image sensor chips and wafer level lens modules in grades into different quality grades (S300) is to be performed. Every image sensor chip 10 in the silicon wafer 40 has to be tested and verified as operating normally. Likewise, the wafer level lens modules 20 have to be tested in their quality. After tested, the image sensor chips 10 and the wafer level lens module 20 can be sorted according to different quality grades.

Figure 5C:
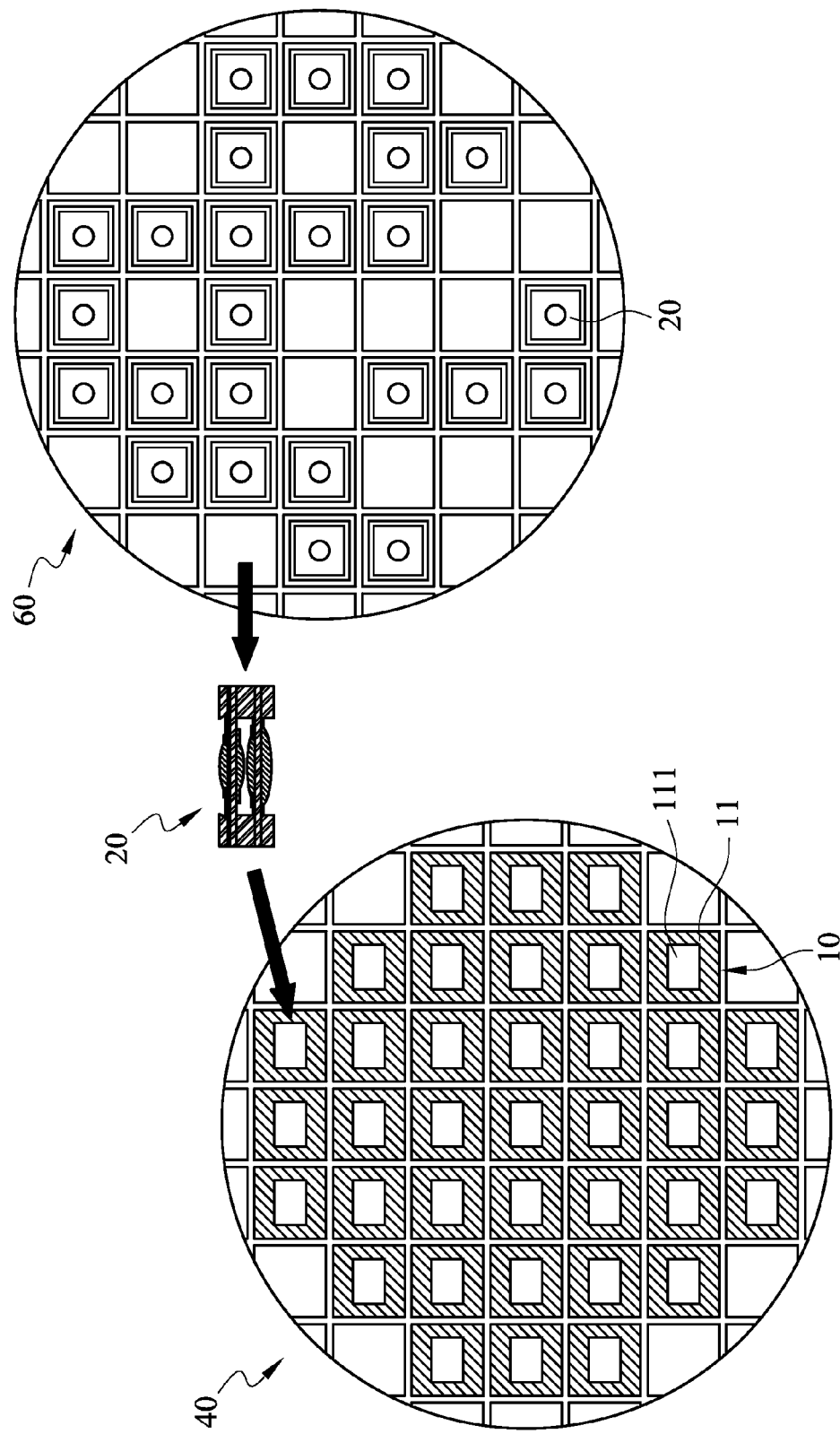
FIG. 5C is a schematic drawing illustrating a step of according to the sorting results, assigning each said wafer level lens module to be situated above the image sensor chip that has the same grade as recited in FIG. 2.

Then the method involves according to the sorting results, assigning each said wafer level lens module to be situated above the image sensor chip that has the same grade (S400). According to the sorting results, the image sensor chips 10 and the wafer level lens modules 20 can be substantially divided into at least a good groups and an acceptable group. Thus, as shown in FIG. 5C, good wafer level lens modules 20 are assigned to be situated above the good image sensor chips 10, while the acceptable wafer level lens modules 20 are assigned to be situated above the acceptable image sensor chip 10, thereby improving the production yield of the resultant wafer level image sensor modules.

Each said wafer level lens module 20 is aligned to the photosensitive area 111 of a respective said image sensor chip 10 (as shown in FIG. 1), so that light is allowed to permeate lenses in the wafer level lens module 20 and focused on the photosensitive elements 13 of the image sensor chip 10.

Figure 6A:
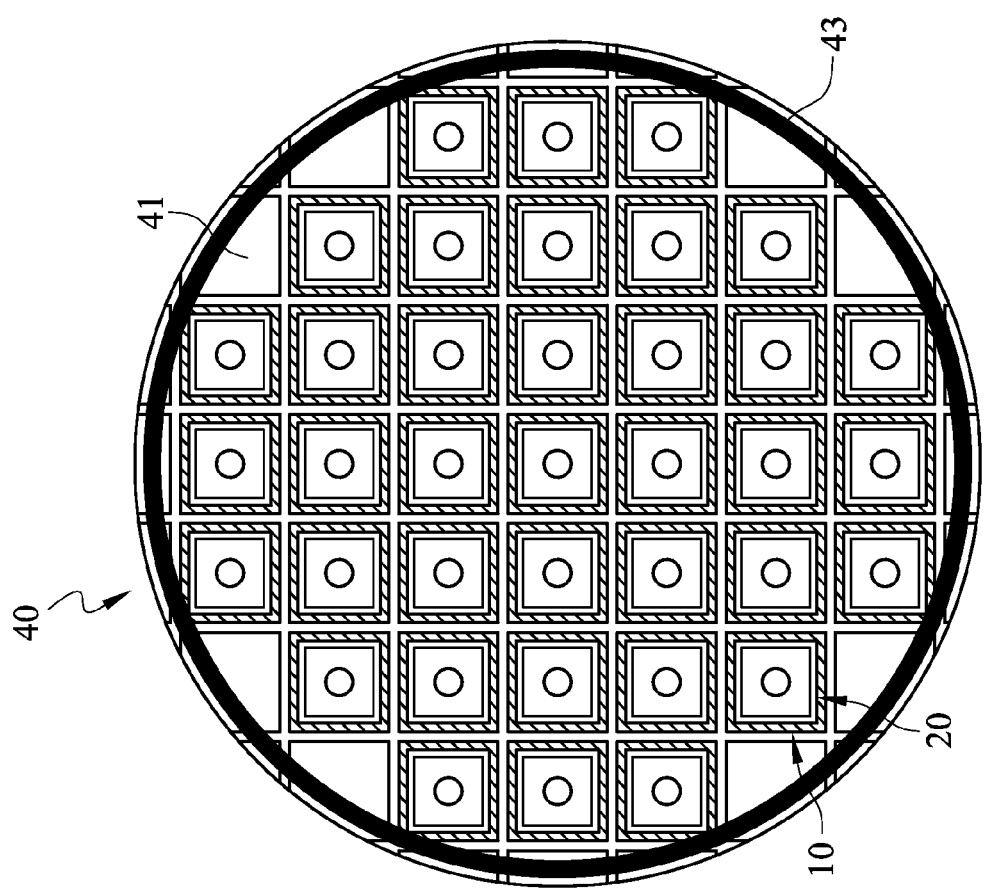
FIG. 6A through FIG. 6C illustrate a first aspect of the packaging process according to FIG. 3.
Figure 6B:
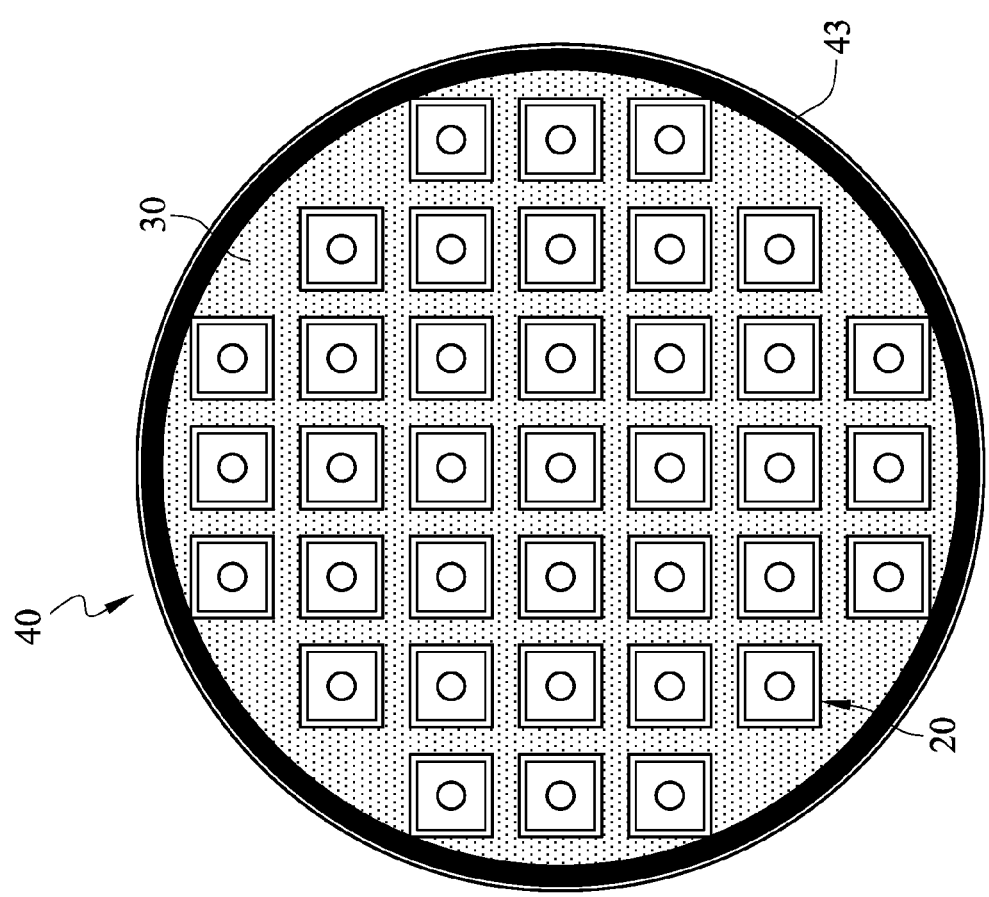
Figure 6C:
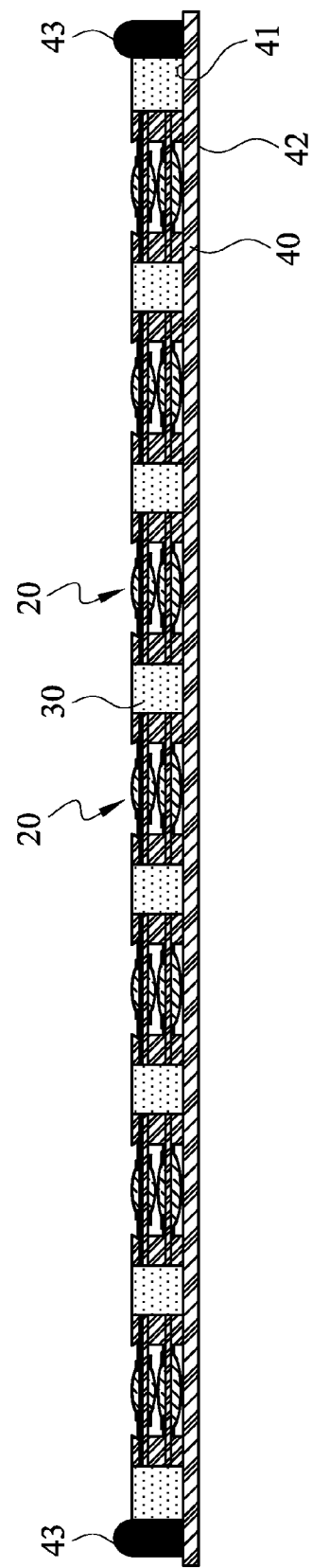
Figure 7A:
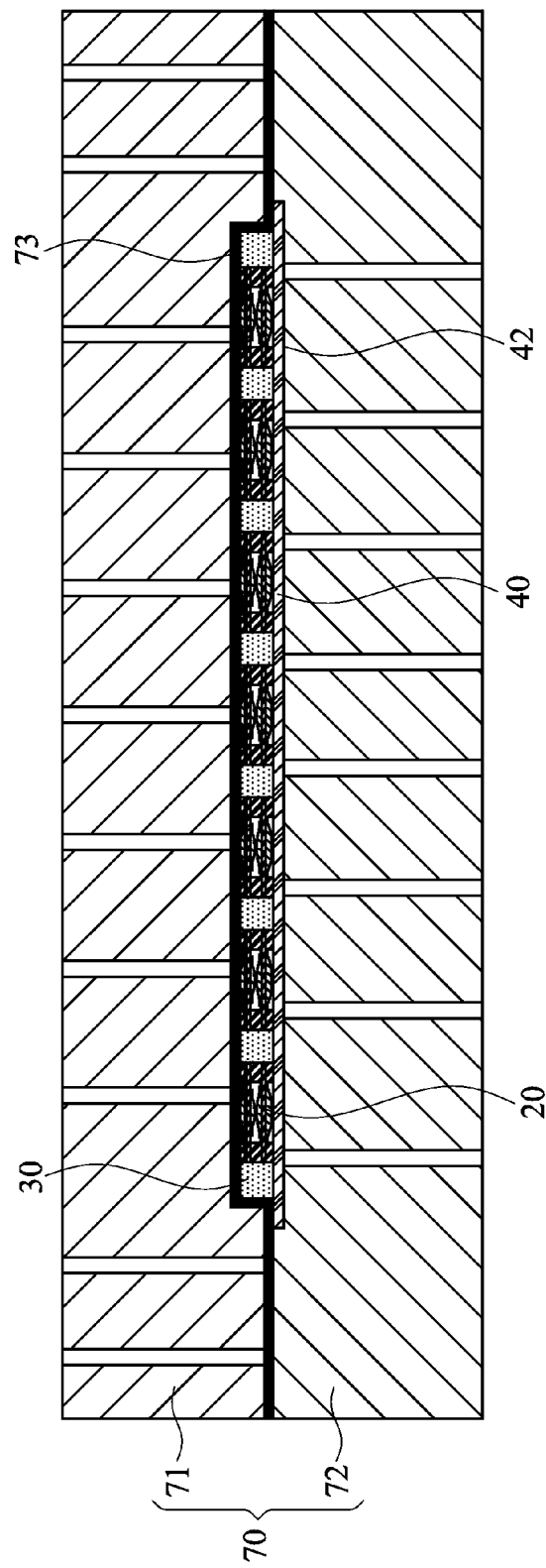
FIG. 7A through FIG. 7C illustrate a second aspect of the packaging process according to FIG. 4.
Figure 7B:
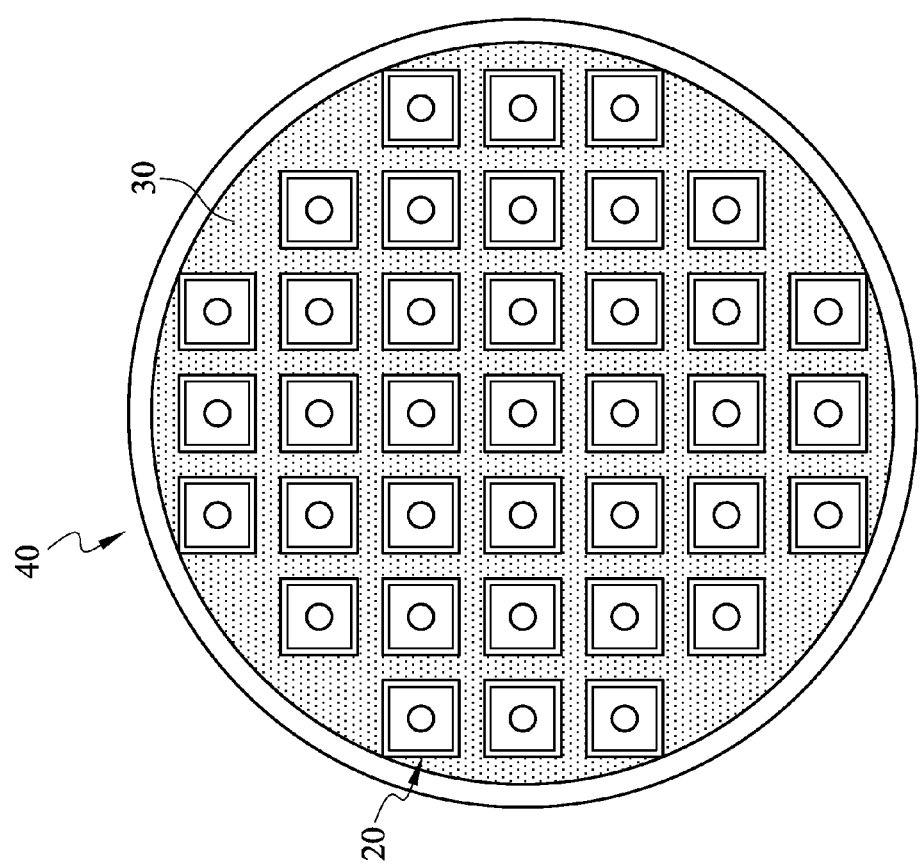
Figure 7C:
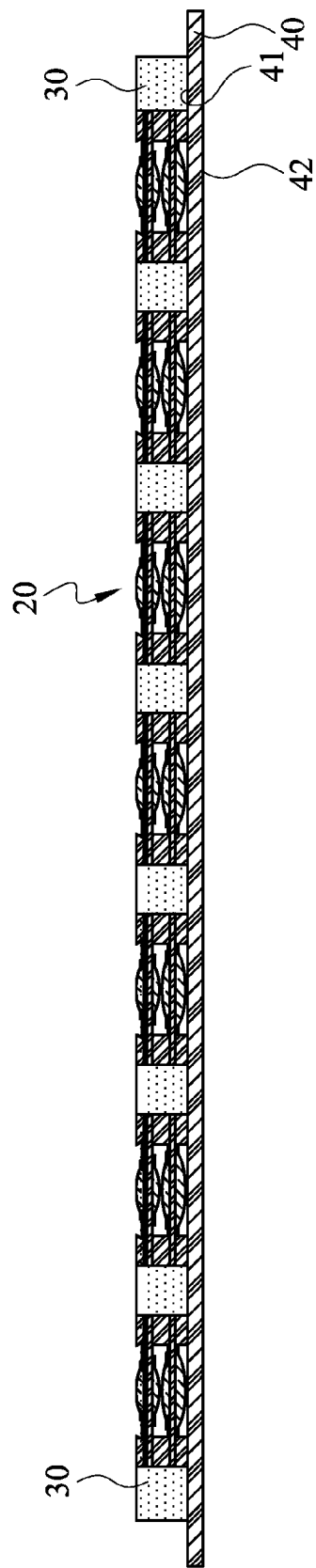

In the step of performing the packaging process (S500), referring to FIG. 6C and FIG. 7C at the same time, during the packaging process, the encapsulation material 30 is arranged on the first surface 41 of the silicon wafer 40 to make the encapsulation material 30 surround the wafer level lens module 20, so as to package the wafer level lens modules 20 and image sensor chips 10 of the silicon wafer 40. Therein, the packaging process (S500) may have two aspects in practice, as described hereinafter.

As show in FIG. 3, the first aspect of the packaging process (S500) comprises steps of: providing a dam along a periphery of the first surface to form a circular structure (S510); and dispensing the encapsulation material in the dam and making the encapsulation material surround the wafer level lens modules (S511).

In the step of providing the dam along the periphery of the first surface to form the circular structure (S510), as shown in FIG. 6A, the dam 43 is formed along the periphery of the first surface 41 of the silicon wafer 40 so as to build up the circular structure surrounding the silicon wafer 40, such that all the image sensor chips 10 in the wafer level lens modules 20 is within the circular structure defined by the dam 43.

In the step of dispensing the encapsulation material in the dam and making the encapsulation material surround the wafer level lens modules (S511): as shown in FIG. 6B and FIG. 6C, the encapsulation material 30 is applied to the first surface 41 by dispensing, so that the encapsulation material 30 is filled between the dam 43 and the wafer level lens modules 20, such that the encapsulation material 30 surrounds the wafer level lens modules 20 but does not cover upper edges of the wafer level lens modules 20. The used encapsulation material 30 is a liquid compound.

As shown in FIG. 4, the other aspect of the packaging process (S500) involves steps of: placing the silicon wafer having the wafer level lens modules into a mold (S520); introducing the encapsulation material into a mold cavity of the mold, so that the encapsulation material surrounds the wafer level lens modules (S521); and transfer molding and curing the encapsulation material (S522).

In the step of placing the silicon wafer having the wafer level lens modules into the mold (S520), referring to FIG. 7A, the silicon wafer 40 already having the wafer level lens modules 20 is placed into the mold 70. The mold 70 includes an upper mold member 71 and a lower mold member 72. The upper mold member 71 has an inner surface abutting against the upper edges of the wafer level lens modules 20, while the lower mold member 72 supports the silicon wafer 40 and abuts against the second surface 42 of the silicon wafer 40.

In molding, for preventing the upper mold member 71 from directly contacting the upper edges of the wafer level lens modules 20 to cause upper edge bleed of the wafer level lens modules 20, the upper mold member 71 may have a vacuum absorbed buffer layer 73 between the wafer level lens modules 20 and the upper mold member 71 for abutting against the upper edges of the wafer level lens modules 20, so as to prevent upper edge bleed of the wafer level lens modules 20.

In the step of introducing the encapsulation material into the mold cavity of the mold to make the encapsulation material surround the wafer level lens modules (S521), referring to FIG. 7A, the encapsulation material 30 is such introduced into the mold cavity of the mold 70 so that the encapsulation material 30 surround the wafer level lens modules 20 but does not cover the upper edges of the wafer level lens module 20.

In the step of transfer molding and curing the encapsulation material (S522), referring to FIG. 7B and FIG. 7C together, after the encapsulation material 30 is introduced into the mold cavity of the mold 70, pressure is applied to the mold 70 to perform transfer molding to the encapsulation material 30. Then the mold is opened for a post mold cure process where the encapsulation material 30 is cured. The used encapsulation material 30 is a mold compound.

Referring to FIG. 2, after the above-described packaging process (S500), the solder balls are placed (S600), and then the silicon wafer is cut into a plurality of wafer level image sensor modules (S700).

Figure 8:
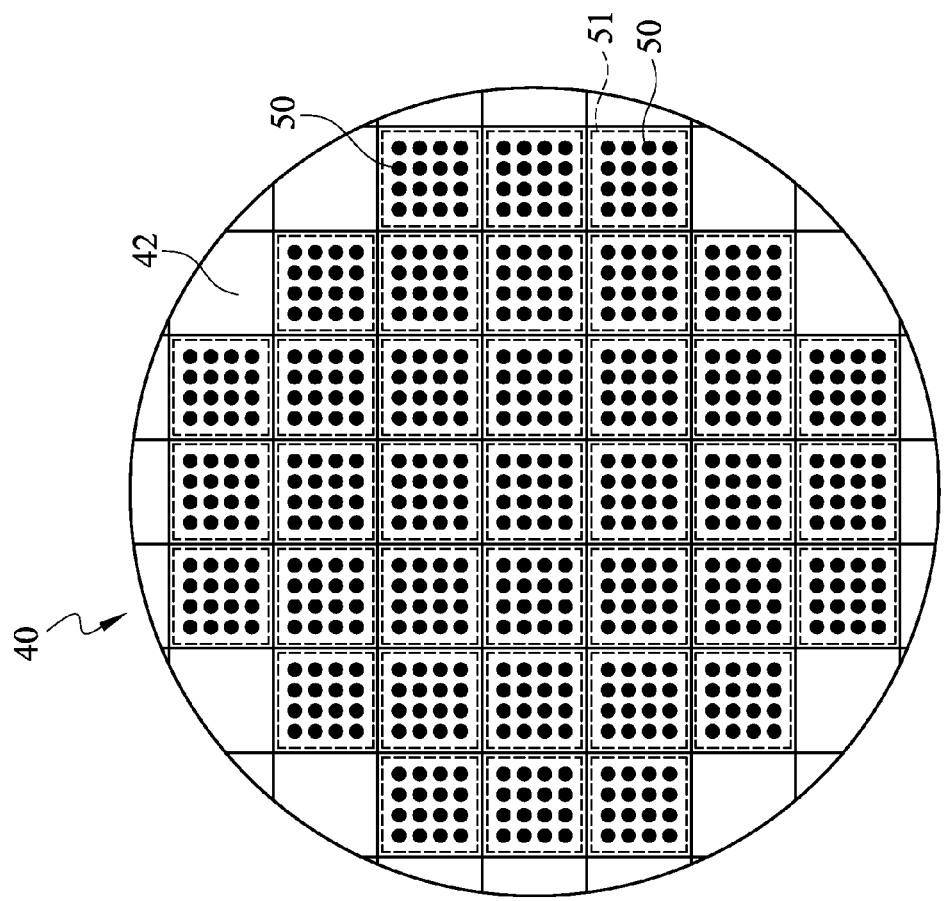
FIG. 8 is a schematic drawing of the silicon wafer second surface placed with solder balls according to one embodiment of the present invention.

In the step of placing the solder balls (S600), as shown in FIG. 8, at the end of the packaging process, the silicon wafer 40 is overturned to have the second surface 42 provided with the solder balls 50. The solder balls 50 placed on the solder ball pads 121 to form a ball grid array 51, so that the image sensor chip 10 is allowed to be electrically connected to an external device (such as a circuit substrate) through the first contacts 112, the conducting channel 14, the solder ball pads 121 and the solder balls 50.

Figure 9:
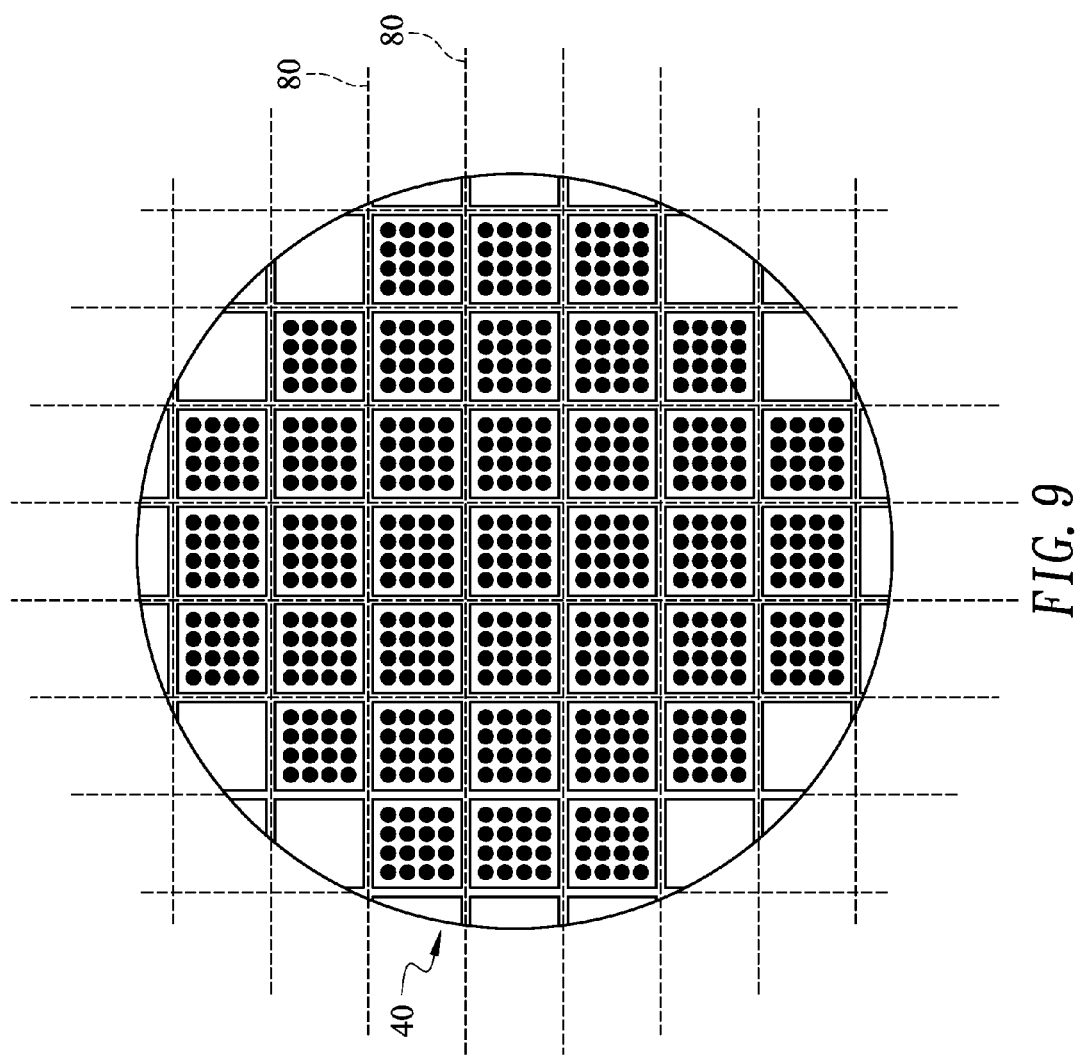
FIG. 9 is a schematic drawing illustrating the silicon wafer to be cut into a plurality of wafer level image sensor modules according to one embodiment of the present invention.

In the step of cutting the silicon wafer into plural wafer level image sensor modules (S700), referring to FIG. 9 together, the silicon wafer 40 may be divided according to preset cutting lines 80, so as to form the plural wafer level image sensor modules wherein each of the wafer level image sensor modules has the structure as shown in FIG. 1.

By implementing the present embodiment, the quality-based sorting mechanism allows the wafer level lens modules 20 and the image sensor chip 10 of the same grades to be assembled mutually, so as to improve the production yield of the wafer level image sensor modules. Furthermore, in the case where the opaque encapsulation material 30 is used, shading can be achieved by blocking light from entering through the lateral of the wafer level lens module 20, so as to prevent the problems related to poor image quality such as flare without using additional shadow masks or additionally coating a shading material.

Moreover, the present invention, by using the silicon wafer 40 as a product of a through-silicon via process, eliminates a substrate as required by a COB process, so as to reduce the overall height of the wafer level image sensor module. Besides, since the structure of the wafer level lens module 20 is made with fixed focal length, a focusing process can be saved, so as to not only simplify the manufacturing process of the wafer level image sensor module, but also reduce the cost for material because the wafer level image sensor module is shortened.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A manufacturing method for a wafer level image sensor module with fixed focal length, comprising steps of:
   providing a silicon wafer including a plurality of image sensor chips wherein each said image sensor chip has a photosensitive area;
   providing a lens module array wafer that includes a plurality of wafer level lens modules, wherein each said wafer level lens module has a fixed focal length;
   testing and sorting all of the image sensor chips and the wafer level lens modules in grades according to different quality grades;
   according to the sorting results, assigning each said wafer level lens module, which is cut from the lens module array wafer, to be situated on the image sensor chip that has the same grade and making each said wafer level lens module aligned with a respective said photosensitive area; and
   performing a packaging process, which comprises steps of:
   placing the silicon wafer having the wafer level lens modules into a mold; introducing an encapsulation material into a mold cavity of the mold, such that the encapsulation material surrounds the wafer level lens modules and onto a first surface of the silicon wafer but does not cover upper edges of the wafer level lens modules; and after transfer molding the encapsulation material, opening the mold and performing a post mold cure process to cure the encapsulation material;
   wherein the mold comprises an upper mold member having a vacuum absorbed buffer layer for abutting against the upper edges of the wafer level lens modules and a lower mold member abutting against a second surface of the silicon wafer.

2. The manufacturing method of claim 1, wherein the silicon wafer is a through-silicon via (TSV) wafer that has a second surface formed with a re-distribution layer and a plurality of solder ball pads.

3. The manufacturing method of claim 1, wherein the encapsulation material is a mold compound.

4. The manufacturing method of claim 1, further comprising, after the step of performing the packaging process, steps of:
   placing solder balls on a second surface of the silicon wafer; and
   cutting the silicon wafer to form a plurality of said wafer level image sensor modules.

* * * * *